United States Patent
Wu et al.

(10) Patent No.: US 11,017,833 B2
(45) Date of Patent: May 25, 2021

(54) APPARATUSES AND METHODS FOR PURE-TIME, SELF ADOPT SAMPLING FOR ROW HAMMER REFRESH SAMPLING

(71) Applicant: MICRON TECHNOLOGY, INC., Boise, ID (US)

(72) Inventors: Jun Wu, Su Zhou (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 16/084,119

(22) PCT Filed: May 24, 2018

(86) PCT No.: PCT/CN2018/088203
§ 371 (c)(1),
(2) Date: Sep. 11, 2018

(87) PCT Pub. No.: WO2019/222960
PCT Pub. Date: Nov. 28, 2019

(65) Prior Publication Data
US 2020/0294569 A1   Sep. 17, 2020

(51) Int. Cl.
*G11C 7/00* (2006.01)
*G11C 11/406* (2006.01)

(52) U.S. Cl.
CPC .................. *G11C 11/406* (2013.01)

(58) Field of Classification Search
CPC ............. G11C 11/40611; G11C 11/406; G11C 11/40615; G11C 11/4087; G11C 11/40618; G11C 11/408; G11C 11/4076
See application file for complete search history.

(56) References Cited

U.S. PATENT DOCUMENTS

| | | | |
|---|---|---|---|
| 5,654,929 A | 8/1997 | Mote, Jr. | |
| 5,956,288 A | 9/1999 | Bermingham et al. | |

(Continued)

FOREIGN PATENT DOCUMENTS

| | | |
|---|---|---|
| CN | 104350546 A | 2/2015 |
| CN | 106710621 A | 5/2017 |

(Continued)

OTHER PUBLICATIONS

International Search Report and Written Opinion for Application No. PCT/US2019/040169, dated Oct. 25, 2019.

(Continued)

*Primary Examiner* — Hien N Nguyen
(74) *Attorney, Agent, or Firm* — Dorsey & Whitney LLP (57) ABSTRACT

Apparatuses and methods for pure-time, self-adopt sampling for RHR refresh. An example apparatus includes a memory bank comprising a plurality of rows each associated with a respective row address, and a sampling timing generator circuit configured to provide a timing signal having a plurality of pulses. Each of the plurality of pulses is configured to initiate sampling of a respective row address associated with a row of the plurality of rows to detect a row hammer attack. The sampling timing generator includes first circuitry configured to provide a first subset of pulses of the plurality of pulses during a first time period and includes second circuitry configured to initiate provision of a second subset of pulses of the plurality of pulses during a second time period after the first time period.

20 Claims, 6 Drawing Sheets

(56) References Cited

U.S. PATENT DOCUMENTS

| | | |
|---|---|---|
| 5,959,923 A | 9/1999 | Matteson et al. |
| 5,999,471 A | 12/1999 | Choi |
| 6,002,629 A | 12/1999 | Kim et al. |
| 6,306,721 B1 | 10/2001 | Teo et al. |
| 6,363,024 B1 | 3/2002 | Fibranz |
| 6,392,952 B1 | 5/2002 | Chen et al. |
| 7,002,868 B2 | 2/2006 | Takahashi |
| 7,082,070 B2 | 7/2006 | Hong |
| 7,203,113 B2 | 4/2007 | Takahashi et al. |
| 8,174,921 B2 | 5/2012 | Kim et al. |
| 8,400,805 B2 | 3/2013 | Yoko |
| 8,572,423 B1 | 10/2013 | Isachar et al. |
| 9,236,110 B2 | 1/2016 | Bains et al. |
| 9,251,885 B2 | 2/2016 | Greenfield et al. |
| 9,299,400 B2 | 3/2016 | Bains et al. |
| 9,406,358 B1 | 8/2016 | Lee |
| 9,653,139 B1 | 5/2017 | Park |
| 9,691,466 B1 | 6/2017 | Kim |
| 9,734,887 B1 | 8/2017 | Tavva |
| 9,812,185 B2 | 11/2017 | Fisch et al. |
| 9,818,469 B1 | 11/2017 | Kim et al. |
| 9,865,328 B1 | 1/2018 | Desimone et al. |
| 10,090,038 B2 | 10/2018 | Shin |
| 10,381,327 B2 | 8/2019 | Ramachandra et al. |
| 10,490,250 B1 | 11/2019 | Ito et al. |
| 10,490,251 B2 | 11/2019 | Wolff |
| 10,510,396 B1 | 12/2019 | Notani et al. |
| 10,572,377 B1 | 2/2020 | Zhang et al. |
| 10,573,370 B2 | 2/2020 | Ito et al. |
| 10,685,696 B2 | 6/2020 | Brown et al. |
| 2002/0026613 A1 | 2/2002 | Niiro |
| 2002/0191467 A1 | 12/2002 | Matsumoto et al. |
| 2003/0026161 A1 | 2/2003 | Yamaguchi et al. |
| 2003/0081483 A1 | 5/2003 | De Paor et al. |
| 2003/0161208 A1 | 8/2003 | Nakashima et al. |
| 2003/0231540 A1 | 12/2003 | Lazar et al. |
| 2004/0024955 A1 | 2/2004 | Patel |
| 2005/0002268 A1 | 1/2005 | Otsuka et al. |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2006/0018174 A1 | 1/2006 | Park et al. |
| 2006/0104139 A1 | 5/2006 | Hur et al. |
| 2006/0215474 A1 | 9/2006 | Hokenmaier |
| 2006/0233012 A1 | 10/2006 | Sekiguchi et al. |
| 2006/0262617 A1 | 11/2006 | Lee |
| 2006/0268643 A1 | 11/2006 | Schreck et al. |
| 2007/0002651 A1 | 1/2007 | Lee |
| 2007/0028068 A1 | 2/2007 | Golding et al. |
| 2007/0147154 A1 | 6/2007 | Lee |
| 2007/0263442 A1 | 11/2007 | Cornwell et al. |
| 2008/0212386 A1 | 9/2008 | Riho |
| 2008/0224742 A1 | 9/2008 | Pomichter |
| 2008/0306723 A1 | 12/2008 | De Ambroggi et al. |
| 2009/0021999 A1 | 1/2009 | Tanimura et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0228739 A1 | 9/2009 | Cohen et al. |
| 2009/0296510 A1 | 12/2009 | Lee et al. |
| 2010/0005217 A1 | 1/2010 | Jeddeloh |
| 2010/0097870 A1 | 4/2010 | Kim et al. |
| 2010/0141309 A1 | 6/2010 | Lee |
| 2010/0182863 A1 | 7/2010 | Fukiage |
| 2011/0225355 A1 | 9/2011 | Kajigaya |
| 2011/0299352 A1* | 12/2011 | Fujishiro ............... G11C 11/406 365/222 |
| 2012/0014199 A1 | 1/2012 | Narui |
| 2012/0155173 A1 | 6/2012 | Lee et al. |
| 2012/0155206 A1* | 6/2012 | Kodama ............... H03K 5/13 365/222 |
| 2012/0287727 A1 | 11/2012 | Wang |
| 2012/0307582 A1 | 12/2012 | Marumoto et al. |
| 2012/0327734 A1* | 12/2012 | Sato ............... G11C 11/40615 365/226 |
| 2013/0028034 A1 | 1/2013 | Fujisawa |
| 2013/0051157 A1 | 2/2013 | Park |
| 2013/0051171 A1 | 2/2013 | Porter et al. |
| 2014/0006700 A1 | 1/2014 | Schaefer et al. |
| 2014/0006703 A1 | 1/2014 | Bains et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0089758 A1 | 3/2014 | Kwok et al. |
| 2014/0095780 A1 | 4/2014 | Bains et al. |
| 2014/0119091 A1 | 5/2014 | You et al. |
| 2014/0143473 A1 | 5/2014 | Kim et al. |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0078112 A1 | 3/2015 | Huang |
| 2015/0092508 A1 | 4/2015 | Bains |
| 2015/0109871 A1 | 4/2015 | Bains et al. |
| 2015/0213872 A1 | 7/2015 | Mazumder et al. |
| 2015/0294711 A1 | 10/2015 | Gaither et al. |
| 2015/0356048 A1 | 12/2015 | King |
| 2015/0380073 A1* | 12/2015 | Joo ............... G11C 11/406 365/189.05 |
| 2016/0070483 A1 | 3/2016 | Yoon et al. |
| 2016/0086649 A1 | 3/2016 | Ho |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0202926 A1 | 7/2016 | Benedict |
| 2016/0225433 A1 | 8/2016 | Bains et al. |
| 2016/0343423 A1 | 11/2016 | Shido |
| 2017/0011792 A1 | 1/2017 | Oh et al. |
| 2017/0052722 A1 | 2/2017 | Ware et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0186481 A1 | 6/2017 | Oh et al. |
| 2017/0269861 A1 | 9/2017 | Lu et al. |
| 2017/0287547 A1 | 10/2017 | Ito et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0075927 A1 | 3/2018 | Jeong et al. |
| 2018/0096719 A1 | 4/2018 | Tomishima et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0190340 A1 | 7/2018 | Kim et al. |
| 2018/0218767 A1* | 8/2018 | Wolff ............... G11C 11/4096 |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0294028 A1 | 10/2018 | Lee et al. |

(56) References Cited

U.S. PATENT DOCUMENTS

| | | |
|---|---|---|
| 2018/0308539 A1 | 10/2018 | Ito et al. |
| 2018/0341553 A1 | 11/2018 | Koudele et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0122723 A1* | 4/2019 | Ito .................. G11C 11/403 |
| 2019/0129651 A1 | 5/2019 | Wuu et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0205253 A1 | 7/2019 | Roberts |
| 2019/0252020 A1 | 8/2019 | Rios et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0194056 A1 | 6/2020 | Sakurai et al. |
| 2020/0210278 A1 | 7/2020 | Rooney et al. |
| 2020/0211633 A1 | 7/2020 | Okuma |
| 2020/0211634 A1 | 7/2020 | Ishikawa et al. |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0321049 A1 | 10/2020 | Meier et al. |

FOREIGN PATENT DOCUMENTS

| | | |
|---|---|---|
| CN | 107871516 A | 4/2018 |
| JP | 4911510 B2 | 1/2012 |
| JP | 6281030 B1 | 1/2018 |
| WO | 2019222960 A1 | 11/2019 |
| WO | 2020010010 A1 | 1/2020 |
| WO | 2020117686 | 6/2020 |

OTHER PUBLICATIONS

U.S. Appl. No. 16/537,981 titled "Apparatuses and Methods for Controlling Targeted Refresh Rates" filed Aug. 12, 2019.
U.S. Appl. No. 16/655,110 titled "Apparatuses and Methods for Dynamic Targeted Refresh Steals" filed Oct. 16, 2019.
U.S. Appl. No. 16/549,411 titled "Apparatuses and Methods for Dynamic Refresh Allocation" filed Aug. 23, 2019.
U.S. Appl. No. 16/682,606, titled "Apparatuses and Methods for Distributing Row Hammer Refresh Events Across a Memory Device", filed Nov. 13, 2019.
International Search Report & Written Opinion dated Mar. 24, 2020 for PCT Application No. PCT/US2019/064028, 11 pages.
U.S. Appl. No. 16/818,989, titled "Semiconductor Device Performing Row Hammer Refresh Operation", dated Mar. 13, 2020.
U.S. Appl. No. 16/818,981 titled "Apparatuses and Methods for Staggered Timing of Targeted Refresh Operations" filed Mar. 13, 2020.
U.S. Appl. No. 16/824,460, titled "Semiconductor Device Performing Row Hammer Refresh Operation", dated Mar. 19, 2020.
U.S. Appl. No. 16/886,284, titled "Apparatuses and Methods for Access Based Refresh Timing", dated May 28, 2020.
International Search Report and Written Opinion dated Feb. 20, 2019 for PCT Application No. PCT/CN2018/088203, 9 pages.
U.S. Appl. No. 16/025,844, titled "Apparatus and Methods for Triggering Row Hammer Address Sampling", filed Jul. 2, 2018.
U.S. Appl. No. 16/176,932, titled "Apparatuses and Methods for Access Based Refresh Timing", filed Oct. 31, 2018.
U.S. Appl. No. 16/230,300, titled "Apparatuses and Methods for Staggered Timing of Targeted Refresh Operations" filed Dec. 21, 2018.
U.S. Appl. No. 16/232,837, titled "Apparatuses and Methods for Distributed Targeted Refresh Operations", filed Dec. 26, 2018.
U.S. Appl. No. 16/286,187 titled "Apparatuses and Methods for Memory Mat Refresh Sequencing" filed Feb. 26, 2019.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 16/375,716 titled "Stagger RHR Pumping Scheme Across Die Banks" filed Apr. 4, 2019; pp. all.
U.S. Appl. No. 16/431,641 titled "Apparatuses and Methods for Controlling Steal Rates" filed Jun. 4, 2019.
International Search Report & Written Opinion dated Aug. 28, 2020 for PCT Application No. PCT/US2020/032931.
International Search Report and Written Opinion for PCT/US2020/026689 dated Jul. 22, 2020.
U.S. Appl. No. 17/008,396 titled "Apparatuses and Methods for Staggered Timing of Targeted Refresh Operations" filed Aug. 31, 2020.
U.S. Appl. No. 16/997,766 titled "Refresh Logic Circuit Layouts Thereof" filed Aug. 19, 2020.
U.S. Appl. No. 17/095,978 titled "Apparatuses and Methods for Controlling Refresh Timing" filed Nov. 12, 2020.
U.S. Appl. No. 17/030,018, titled "Apparatuses and Methods for Controlling Refresh Operations", filed Sep. 23, 2020.
U.S. Appl. No. 17/175,485 titled "Apparatuses and Methods for Distributed Targeted Refresh Operations" filed Feb. 12, 2021.
U.S. Appl. No. 17/186,913 titled "Apparatuses and Methods for Dynamic Refresh Allocation" filed Feb. 26, 2021.
U.S. Appl. No. 17/187,002 titled "Apparatuses and Methods for Staggered Timing of Targeted Refresh Operations" filed Feb. 26, 2021.

* cited by examiner

APPARATUSES AND METHODS FOR PURE-TIME, SELF ADOPT SAMPLING FOR ROW HAMMER REFRESH SAMPLING

RELATED APPLICATIONS

This application is a 371 National Stage application claiming priority to PCT Application No. PCT/CN2018/088203, filed May 24, 2018, which application is incorporated herein by reference in its entirety, for any purpose.

BACKGROUND

High data reliability, high speed of memory access, and reduced chip size are features that are demanded from semiconductor memory. A dynamic random access memory (DRAM), which is a typical semiconductor memory device, stores information by charges accumulated in cell capacitors, and, therefore, the information is lost unless refresh operations are periodically carried out. The information may be further lost as bit errors due to Row Hammer effects and/or Ras-Clobber effects. In either case, such bit errors may take place on one or more memory cells each coupled to a non-selected word line that is adjacent to a selected word line subjected to Row Hammer (indicating that the selected word line is driven to an active level a great number of times successively) or Ras-Clobber (indicating that the selected word line is driven to the active level continuously for a considerably long period). The memory cells coupled to such non-selected word line are thus required to be refreshed prior to losing the information stored therein. On the other hand, auto-refresh (AREF) commands indicating refresh operations are periodically issued from a control device such as a memory controller, which controls a DRAM. The AREF commands are provided from the control device at a frequency that all the word lines are certainly refreshed once in the one refresh cycle (for example, 64 msec). However, refresh addresses according to the AREF commands are determined by a refresh counter provided in DRAM. For this reason, refresh operations responsive to the AREF commands may not prevent bit errors due to Row Hammer effects and/or Ras-Clobber effects. Thus, steal-refresh is carried out to perform Row Hammer refresh (RHR) operations in which some of refresh operations responsive to the AREF commands are stolen therefrom and then allocated to the RHR operations to refresh the memory cells coupled to the non-selected word line that is adjacent to the selected word line subjected to Row Hammer and/or Ras-Clobber.

One way to dynamically control the steal-refresh is time-based random sampling of a row address by randomizing timings for sampling. However, some implementations that use random sampling can have periods where no sampling is taking place if the time between RHR operations is too long.

SUMMARY

Example apparatuses are described herein. An example apparatus may include a memory bank comprising a plurality of rows each associated with a respective row address, and a sampling timing generator circuit configured to provide a timing signal having a plurality of pulses. Each of the plurality of pulses is configured to initiate sampling of a respective row address associated with a row of the plurality of rows to detect a row hammer attack. The sampling timing generator includes first circuitry configured to provide a first subset of pulses of the plurality of pulses during a first time period and includes second circuitry configured to initiate provision of a second subset of pulses of the plurality of pulses during a second time period after the first time period.

Another example method may include a plurality of memory banks. Each memory bank of the plurality of memory banks includes a latch configured to store an address for interrupt refresh. The example apparatus may further include a sampling timing generator circuit configured to receive an oscillation signal. The sampling timing generator circuit comprises first circuitry configured to provide a first set of pulses on a trigger signal to sample the address during a first time period. The sampling timing generator circuit further comprises second circuitry configured to determine whether to initiate provision of a second set of pulses on the trigger signal to sample the address during a second time period. The first time period and the second time period are non-overlapping time periods.

Example methods are described herein. An example method may include, during a first time period of a row hammer refresh interval, providing a first subset of pulses on a timing signal from a sampling timing generator circuit to trigger sampling of a respective row address associated with a row of a plurality of rows of a memory bank, and during a second time period of the row hammer refresh interval after the first time period, initiating provision of a second subset of pulses on the timing signal.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure. These embodiments are described in sufficient detail to enable those skilled in the art to practice various embodiments of the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

Figure 1:
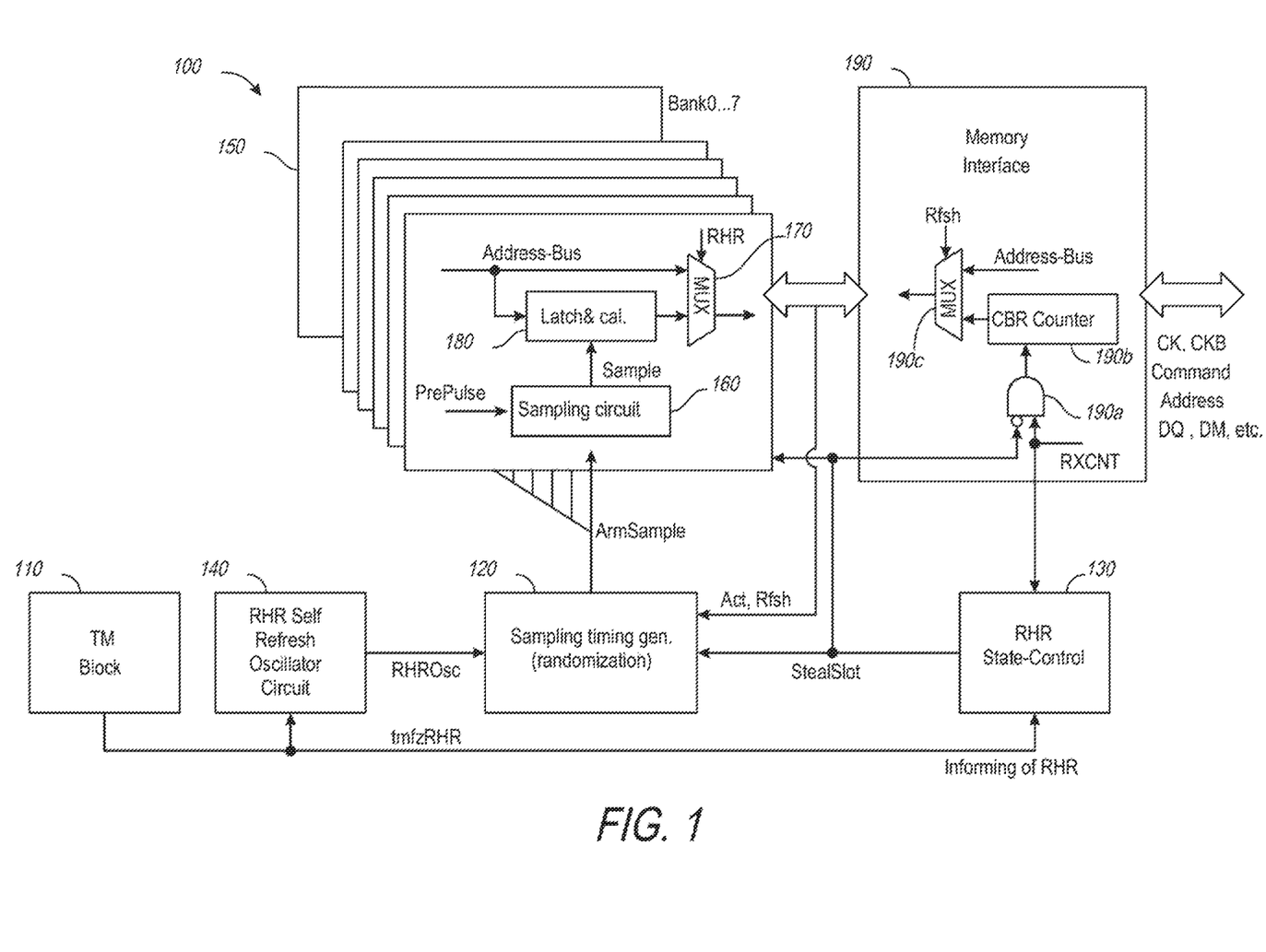
FIG. 1A depicts a block diagram of a semiconductor device in accordance with an embodiment of the disclosure.

FIG. 1 is a block diagram of a semiconductor device 100 in accordance with embodiments of the disclosure. The semiconductor device 100 may include a plurality of memory banks 150 and a sampling, timing generator circuit 120, and a plurality of sampling circuits 160 associated with the plurality of corresponding memory banks 150, in accordance with an embodiment of the disclosure. The semiconductor device 100 may be a semiconductor memory integrated into a single semiconductor chip, for example, an LPDDR4 SDRAM. The semiconductor device 100 may further include a memory interface circuit 190 (e.g., DRAM interface), a row hammer refresh (RHR) state control circuit 130, the sampling timing generator circuit 120, a RHR self-refresh oscillator circuit 140 and a test mode (TM) block 110. For example, the memory interface circuit 190 may be a DRAM interface that may receive and transmit clock signals, command signals, address signals and data signals, etc.

The TM block 110 may provide a steal rate control signal tmfzRHR in order to adjust a steal rate. The steal rate is a rate at which RHR enters into a test mode. The RHR self-refresh oscillator circuit 140 may control a frequency (cycle) of a frequency-divided RHR oscillation signal (RHROsc), responsive, at least in part, to the steal rate control signal tmfzRHR. The RHROsc signal may be used as a clock signal for signaling an internal cycle. The row hammer refresh (RHR) state control circuit 130 may provide an instruction signal StealSlot that is an instruction signal for executing steal-refresh (or RHR) operations instead of normal refresh based on each auto-refresh (AREF) command. For example, the RHR state-control circuit 130 may receive the steal rate control signal tmfzRHR and an RXCNT signal and may provide an instruction signal StealSlot for executing steal-refresh (or RHR) instead of normal refresh. The RXCNT signal is a clock signal obtained from an auto-refresh (AREF) command, and the RXCNT signal is provided to a refresh counter (CBR counter) 190b in the memory interface circuit 190 and the RHR state-control circuit 130.

The sampling timing generator circuit 120 may be provided in common for the plurality of memory banks 150 in FIG. 1. The sampling timing generator circuit 120 may receive the instruction signal StealSlot from the RHR state-control circuit 130 and may further receive the frequency-divided RHR oscillation signal (RHROsc) from the RHR self-refresh oscillator circuit 140 for self-refresh. The sampling timing generator circuit 120 may provide a trigger signal for sampling (ArmSample) to each sampling circuit 160 of each memory bank of the plurality of memory banks 15 (e.g., Bank 0, . . . Bank 7) at a random timing. The ArmSample signal may be randomized by randomization of a frequency of the activation of the ArmSample signal and randomization of a difference between an interval of RHR execution (e.g., each time auto-refresh command is provided) and an interval (e.g., a cycle) of the frequency-divided RHR oscillation signal (RhrOsc). Because a RHR interval length can be random, with some timing intervals significantly larger than others, some conventional circuitry may have periods where no sampling is taking place during the RHR interval, which may pose a risk to a row hammer attack during these extended RHR intervals. To mitigate effects of these no sampling time periods, the sampling timing generator circuit 120 may include circuitry that is configured to initiate trigger of randomized sampling during longer RHR intervals. The circuitry delineates timing periods, from an initial time period PHASE0 to a last time period PHASE4. Each of the timing phases PHASE0-PHASE3 may have a duration of based on a preset maximum counter value. The last time period PHASE4 may persist until an end of the RHR interval. It is appreciated that greater or fewer time periods could be included without departing from the scope of the disclosure. The circuitry may utilize a random count value to randomly initiate a sampling event during the PHASE1 to PHASE4 time periods. This randomized sampling may provide sampling coverage during extended RHR intervals, which is improved over current time-based solutions that have sampling gaps.

The sampling circuit 160 may provide a sampling signal (Sample) responsive to the ArmSample signal and further to a next PrePulse signal that is generated upon a receipt of a precharge command. A latch and calculator 180 (e.g., a latch, a flip-flop, etc.) of each memory bank of the plurality of memory banks 150 (e.g., Bank0, . . . Bank7) may capture (e.g., latch) a row (X) address on an address bus responsive to the sampling signal (Sample). The row address on the address bus is to access a memory array (not shown) provided in each memory bank of the plurality of memory banks 150 (e.g., Bank0, . . . Bank7). The latch and calculator 180 further may calculate an adjacent address of the latched row address and may provide the adjacent address as an RHR refresh address.

A multiplexer MUX 170 may be a switch that may work as a refresh circuit configured to perform a steal-refresh operation to refresh a memory cell designated by the RHR refresh address. The multiplexer MUX 170 may receive the adjacent address from the latch and calculator 180 and the row address from the address bus, and provide either one of the adjacent address and the row address, responsive to an RHR signal that is generated from Rfsh signal. The Rfsh signal may be generated while receiving the auto-refresh (AREF) command. In the RHR operation, the multiplexer MUX 170 may provide the adjacent address responsive to the RHR signal in an active state. The multiplexer MUX 170 may provide the row address responsive to the RHR signal in an inactive state. Thus, either the row address or the adjacent address most recently captured becomes a valid address that is provided to the memory array in the corresponding memory bank.

The row address to the multiplexer MUX 170 may be provided by a multiplexer MUX 190c of the interface circuit 190. The multiplexer MUX 190c may receive an access row address associated with an active command for data reading or writing supplied to the memory interface 190 through an address bus. The multiplexer MUX 190c may further receive a refresh address from a refresh counter (CBR counter) 190b. The CBR counter 190b may receive a logic AND signal of the RXCNT signal and an inverted signal of the instruction signal for RHR execution StealSlot via a logic AND circuit 190a. The refresh counter (CBR counter) 190b may be stopped when the RHR state-control circuit 130 provides the instruction signal for RHR execution StealSlot substantially simultaneously as the RHR signal is generated from the Rfsh signal. The multiplexer MUX 190c may provide the refresh address from the refresh counter (CBR counter) 190b responsive to auto-refresh (AREF) command (the Rfsh signal in an active state). The multiplexer MUX 190c may further provide the row (X) address responsive to a read or write command. Thus, the multiplexer MUX 190c may provide either the refresh address or the row (X) address to the address bus of each memory bank coupled to the multiplexer MUX 170.

Figure 2A:
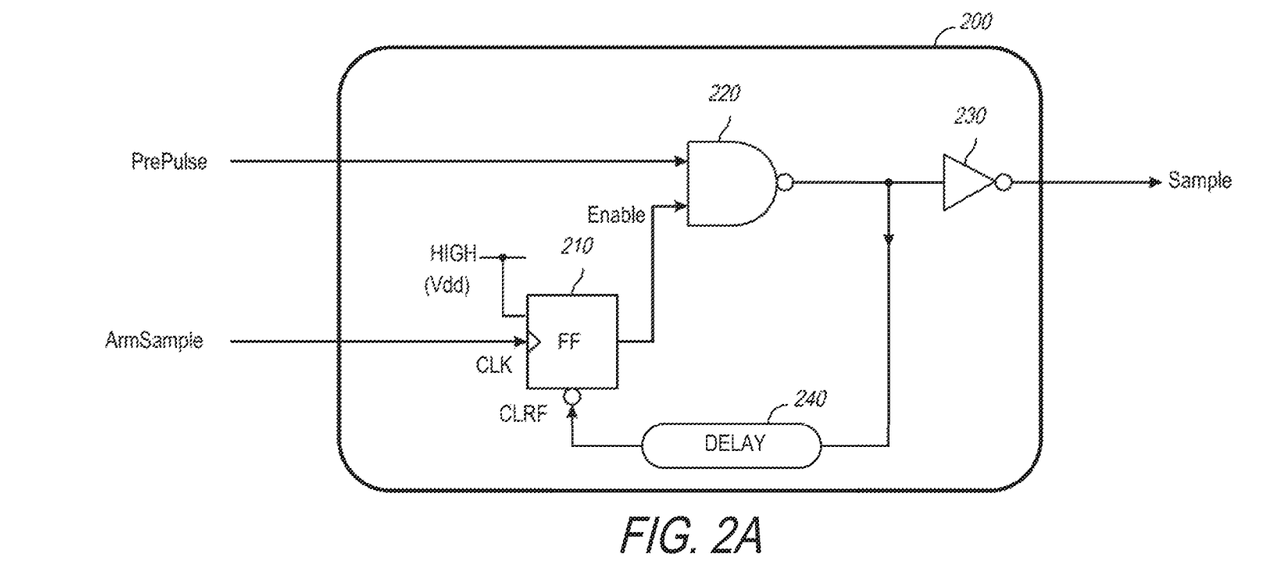
FIG. 2A depicts a circuit diagram a sampling circuit in accordance with an embodiment of the disclosure.

FIG. 2A depicts a circuit diagram a sampling circuit 200 in accordance with embodiments of the disclosure. The sampling circuit 200 may be the sampling circuit 160 in FIG.

1. The sampling circuit 200 may include a latch circuit 210 and a NAND circuit 220. For example, the latch circuit 210 may be a flip-flop that may receive the trigger signal for sampling (ArmSample) from the sampling timing generator circuit 120 at a clock input and a positive power potential (Vdd, a logic high level) at a data input and provide a latched ArmSample signal as an enable signal to the NAND circuit 220. The NAND circuit 220 may receive a PrePulse signal that may be active for one bank among a plurality of banks. The NAND circuit 220 may provide the latched ArmSample signal after inversion at an inverter 230 as a sampling signal (Sample), if the bank related to the received PrePulse signal is active. The latch circuit 210 may be reset by an inversion of the output signal of the NAND circuit 220 with a delay from a delay circuit 240.

Figure 2B:
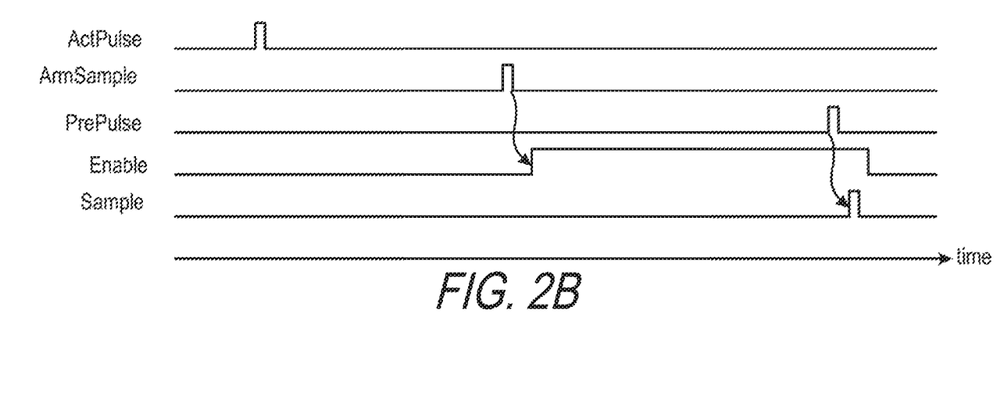
FIG. 2B depicts a timing diagram of signals in the sampling circuit of FIG. 2A in accordance with an embodiment of the present disclosure.

FIG. 2B depicts a timing diagram of signals in the sampling circuit of FIG. 2A in accordance with embodiments of the present disclosure. Responsive to a pulse of an ActPulse signal, a pulse on the ArmSample signal is provided. The latch circuit 210 may provide an enable signal in an active state responsive to the pulse of the ArmSample signal. While the enable signal is in the active state, the NAND circuit 220 may provide a pulse on the Sample signal responsive to a pulse of the PrePulse signal.

Figure 3A:
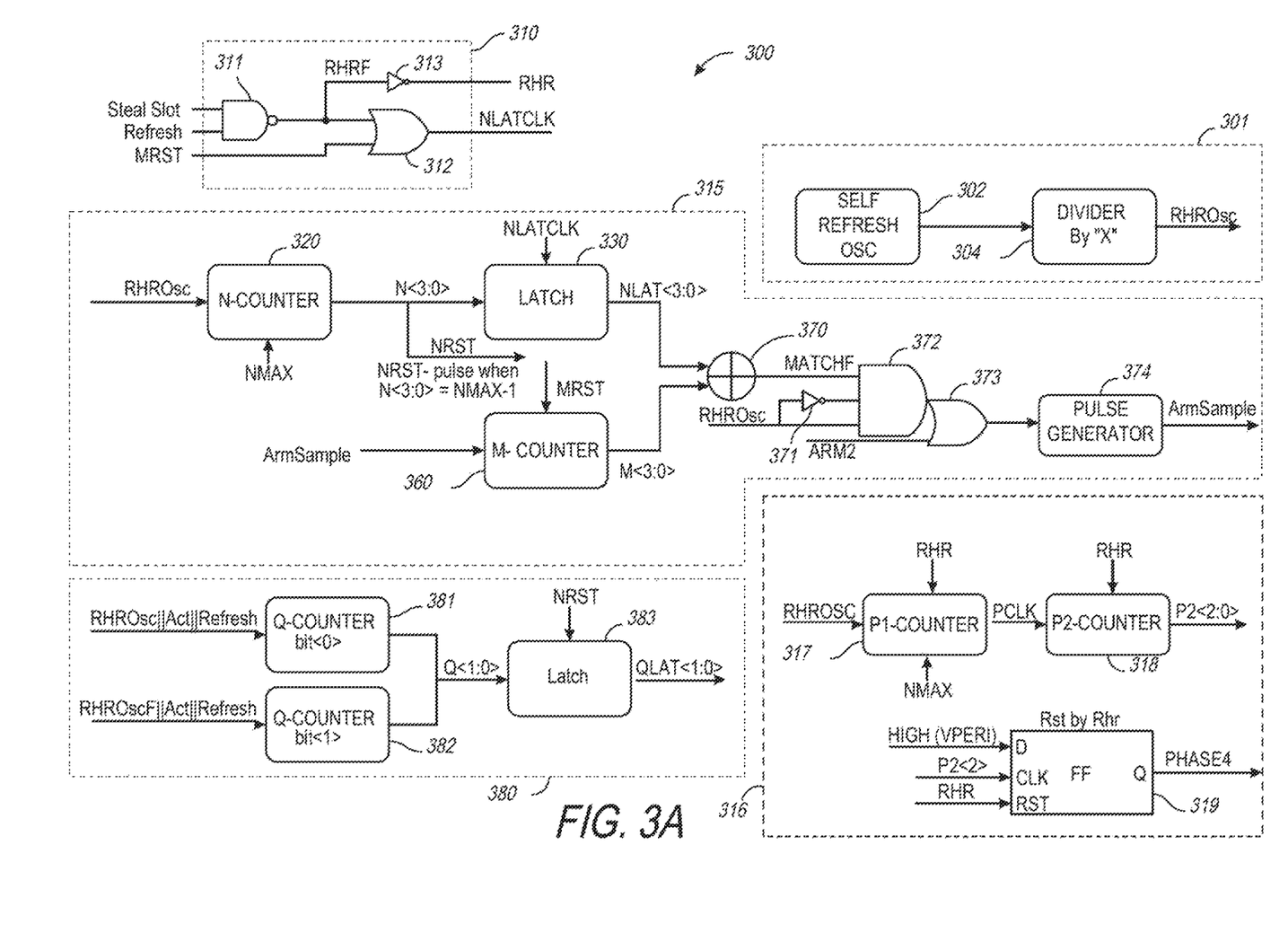
FIGS. 3A and 3B depicts a schematic diagram of a sampling timing generator circuit and a RHR self-refresh oscillator circuit in accordance with an embodiment of the disclosure.
Figure 3B:
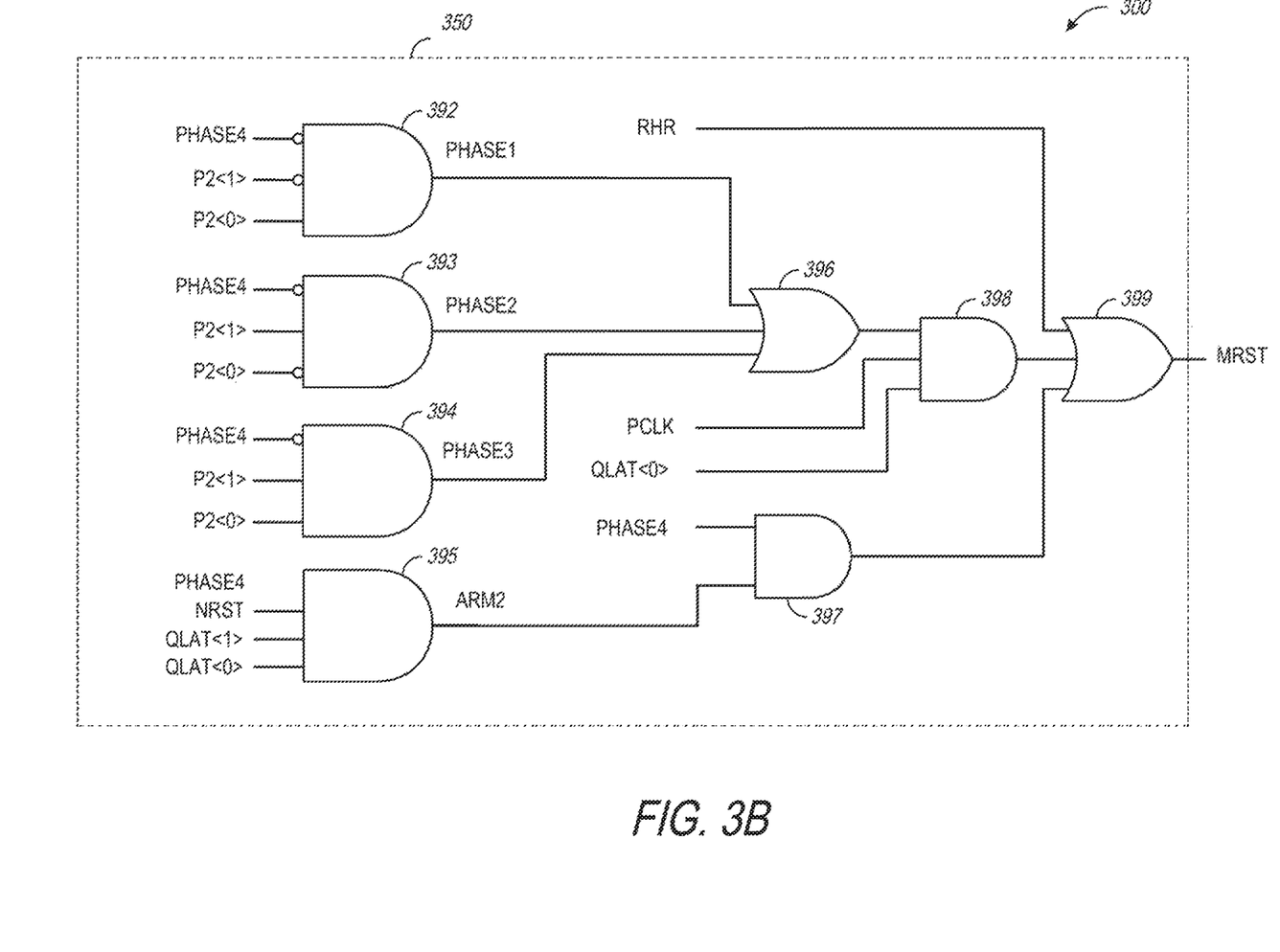

FIGS. 3A and 3B include a schematic diagram of a sampling timing generator circuit 300 and a RHR self-refresh oscillator circuit 301 in accordance with embodiments of the disclosure. For example, the sampling timing generator circuit 300 may be used as the sampling timing generator circuit 120 of FIG. 1 and the RHR self-refresh oscillator circuit 301 may be implemented in the RHR self-refresh oscillator circuit 140 of FIG. 1.

The RHR self-refresh oscillator circuit 301 may include a self-refresh oscillator 302 configured to provide an oscillation signal and a dock divider 304 that is configured to divide the oscillation signal by an X value to generate the RHROsc signal, wherein X is a positive integer value.

The sampling timing generator circuit 300 may include an interval circuit 310, a sampling trigger circuit 315, a secondary counter circuit 316, a counter reset circuit 350, and a randomized counter circuit 380. The interval circuit 310 may include a NAND gate 311, an OR gate 312, and an inverter 313. The NAND gate 311 is configured, to receive a steal slot signal and a refresh signal and to provide an inverted RHRF signal at an output based on the steal slot signal and the refresh signal. The inverter 313 is configured to invert the RHRF signal to provide the RHR signal, which may indicate an active RHR operation. The OR gate 312 is configured to receive an M-counter reset signal MRST and the RHRF signal, and to provide an N-counter clock latch signal NLATCLK based on the MRST and RHRF signals.

The sampling trigger circuit 315 includes circuitry that is configured to provide the ArmSample signal based on the RHROsc signal and the RHR signal. The sampling trigger circuit 315 includes an N-counter 320 coupled to a latch 330. The N-counter 320 may be a free running counter configured to count from zero to one less than a value of the NMAX signal in response to the RHROsc signal. In some examples, the N-counter 320 is a four bit counter. In some examples, the NMAX signal may be set to 9. The N-counter 320 provides an N<3:0> count value to the latch 330. In response to the NLATCLK signal from the interval circuit 310, the latch 330 may latch a value of the N<3:0> count as the NLAT<3:0> count value. An N-counter reset signal NRST may be set when the N<3:0> count value is equal to the NMAX value.

The sampling trigger circuit 315 may further include a M-counter 360 that is configured to toggle in response to an ArmSample signal to provide a M<3:0> count value. The NLAT<3:0> and the M<3:0> count values are compared at the comparator 370 to provide an inverse match signal MATCHF (e.g., the MATCHF signal is high when the NLAT<3:0> and the M<3:0> count values do not match). An AND gate 372 is configured to receive the MATCHF signal and the RHROsc signal and a delayed RHROsc signal via an inverter 371. An output of the AND gate 372 is provided to an OR gate 373, along with the ARM2 signal, and the OR gate 373 is configured to provide a control signal to the pulse generator 374 when either of the output of the AND gate 372 or the ARM2 signals are set.

The secondary counter circuit 316 includes a P1-counter 317, a P2-counter 318, and a flip-flop 319. The P1-counter 317 may include a free-running counter that continuously counts from zero to one less than the NMAX value in response to the RHROsc signal, and provides a pulse on a P-counter clock signal PCLK when the count value of the P1-counter 317 is equal to one less than the NMAX value. The P2-counter 318 is also a free-running counter that counts in response to the PCLK signal to provide a P2<2:0> count value at an output. The P1-counter 317 and the P2-counter 318 may be configured to be reset by the RHR signal form the interval circuit 310. In some examples, the P1-counter 317 is a four bit counter and the P2-counter 318 is a three bit counter. The flip-flop 319 is configured to set a PHASE4 signal to a high value in response to the P2<2> bit value toggling high.

The randomized counter circuit 380 is a randomized two bit counter circuit. The randomized counter circuit 380 includes a Q-counter 381, a Q-counter 382, and a latch 383. The Q-counter 381 is configured to toggle a Q<0> value in response to one of the RHROsc signal, an activate signal ACT, Or a Refresh signal. The Q-counter 382 is configured to toggle a Q<1> bit value in response to one of the RHROscF signal, the ACT signal, or the Refresh signal. The latch 383 is configured to latch the Q<1:0> count value in response to the NRST signal (e.g., when the N<3:0> count value is equal to one less than the NMAX value).

The counter reset circuit 350 includes an AND gate 392, an AND gate 393, an AND gate 394, configured to provide PHASE1, PHASE2, PHASE3 signals, respectively in response to values of the PHASE4 signal, and the P2<1> and P2<0> bit values. For example, the AND gate 392 is configured to set the PHASE1 signal when the PHASE4 signal and the P2<1> bit are not set and the P2<0> bit is set. The AND gate 393 is configured to set the PHASE2 signal when the PHASE4 signal and P2<0> bit are not set and the P2<1> bit is set. The AND gate 394 is configured to set the PHASE3 signal when the PHASE4 signal is not set and the P2<1> and P2<0> bits are set. If none of the PHASE1, PHASE2, PHASE3, and PHASE4 signals is set, then the sampling timing generator circuit 300 is in an initial phase e.g., PHASE0).

The counter reset circuit 350 further includes an AND gate 395 configured to set the ARM2 signal when the PHASE4, the NRST signals, and the bits of the QLAT<1:0> count values are all set. The OR gate 399 is configured to set the MRST signal when one of three conditions are met. First, the OR gate 399 is configured to set the MRST signal when the RHR signal is set (e.g., indicating a RHR event). Second, the OR gate 399 is configured to set the MRST signal when the PHASE4 and the ARM2 signals are set (e.g., via the AND gate 397). And lastly, the OR gate 399 is configured to set the MRST signal, via the AND gate 398, when the PCLK signal and QLAT<0> bit are set and any of the PHASE1, PHASE2, or PHASE3 signals is set (e.g., via the OR gate 396).

In operation, the RHR self-refresh oscillator circuit 301 is configured to provide the RHROsc signal, which is an oscillating signal that serves a counter clock for the N-counter 320, the Q-counter 381, and the Q-counter 382. The sampling timing generator circuit 300 is configured to trigger a sampling event via the ArmSample signal. Timing between RHR events (e.g., a RHR interval that is defined by consecutive pulses of the RHR signal) can be random, with some timing gaps significantly larger than others. Timing may be anticipated based on a count of clock cycles of the RHROsc signal, and the NMAX signal may be set to a value that is slightly larger than an anticipated RHR event gap. During this first or initial time period of an RHR interval, first circuitry (e.g., the N-counter 320, the latch 330, and the M-counter 360) may perform sampling operations within this 0 to NMAX sample time period. However, when the RHR interval is longer than the anticipated maximum, conventional timing-based RHR circuitry may have a gap where no sampling is being triggered by the ArmSample signal. This may pose a risk to a row hammer attack during these extended RHR intervals. To mitigate effects of these no sampling time periods, the sampling timing generator circuit 300 may implement second circuitry (e.g., the OR gate 312, secondary counter circuit 316, counter reset circuit 350, and randomized counter circuit 380) that is configured to initiate trigger of randomized sampling by the first circuitry during longer RHR intervals. The second circuitry delineates timing phases, from an initial time period PHASE0 (e.g., when the P2<2:0> count value is equal to 0), up to PHASE4 (e.g., when the PHASE4 signal is set (e.g., via the flip-flop 319). Each of the timing phases PHASE0-PHASE3 may have a duration of NMAX oscillations of the RHROsc signal. The PHASE4 time period may persist until the end of the RHR interval. The second circuitry may utilize a random QLAT<1:0> count value to randomly initiate a sampling event by the first circuitry.

During an initial phase or time period (e.g., PHASE0) of the RHR interval, the N-counter 320 repeatedly counts from 0 to one minus the NMAX value in response to the RHROsc signal. The latch 330 latches an N<3:0> count value in response to the NLATCLK signal to provide the NLAT<3:0> count value. The NLATCLK signal is set by the MRST signal or the RHRF signal. The MRST signal is set by the counter reset circuit 350 in response to an RHR signal (e.g., indicating initiation of a new RHR interval) or in a randomized fashion (e.g., based on a value of the randomized QLAT<1:0> bits) during one of the phases PHASE1-PHASE4. The NLAT<3:0> count value is compared with the M<3:0> count value of the M-counter 360. When the NLAT<3:0> count value and the M<3:0> count value do not match, the MATCHF signal is set. When the MATCHF signal is set, the AND gate 372 provides a pulse output in response to the RHROsc signal via the inverter 371, which causes the pulse generator 374 to provide a pulse on the ArmSample signal. The M-counter 360 increments the M<3:0> count in response to the pulses of the ArmSample signal. When there is a match between the NLAT<3:0> count value and the M<3:0> count value, the MATCHF signal is set low. In response to the MATCHF signal transitioning low, the AND gate 372 provides a continuous low output, and in response, the pulse generator 374 no longer provides pulse on the ArmSample signal. If the N-counter 320 and M-counter 360 were only reset at a start of the RHR interval via the RHR signal, during a long RHR interval that exceeds NMAX RHROsc oscillations, the sampling trigger circuit 315 would cease triggering sampling events via the ArmSample signal.

To mitigate this no sampling period during longer RHR intervals, the P1-counter 317 and the P2-counter 318 of the secondary counter circuit 316 may provide secondary counter circuitry that is used to track different phase time periods from PHASE0 (e.g., when the P2<2:0> count value is 0) up to PHASE4 (e.g., set via the flip-flop 319 in response to the P2<2> bit being set. The AND gate 392, the AND gate 393, and the AND gate 394 may set the PHASE1, PHASE2, and PHASE3 signals based on the PHASE4 signal and based on values of the P2<1:0> count values. For example, the AND gate 392 is configured to set the PHASE1 signal when the PHASE4 signal and P2<1> bit are not set and the P2<0> bit is set. The AND gate 393 is configured to set the PHASE2 signal when the PHASE4 signal and P2<0> bit are not set and the P2<1> bit is set. The AND gate 394 is configured to set the PHASE3 signal when the PHASE4 signal is not set and the P2<1> and P2<0> bits are set. If none of the PHASE1-PHASE4 signals are set, then the sampling trigger circuit 315 is operating in an initial time period PHASE0. The P1-counter 317 and the P2-counter 318 are reset in response to an RHR event (e.g., the RHR signal being set), which may move the circuitry of the sampling timing generator circuit 300 back to the initial phase PHASE0.

The QLAT<1:0> bits provided by the randomized counter circuit 380 may provide a randomized element to initiating new sampling events via the ArmSample signal during the time periods of PHASE1-PHASE4 (e.g., via the AND gate 395 for PHASE4, and via the OR gate 396 and the AND gate 398 for PHASE1, PHASE2, and PHASE3). That is, the ARM2 signal may be set during a PHASE4 time period in response to a pulse of the NRST signal when the QLAT<1:0> bits are both set. The MRST signal may be set to reset the latch 330 and M-counter 360 counters during any of the PHASE1 to PHASE3 time periods in response to a pulse on the PCLK signal when the QLAT<0> bit is set.

Together, the circuitry of the sampling timing generator circuit 300 provides sampling coverage for long RHR intervals, making a device less susceptible to a row hammer attack as compared with circuitry that has no sampling coverage for longer RHR intervals. It is appreciated that the number of bits in randomized counters may differ from shown without departing from the scope of the disclosure. For example, the N<3:0> (e.g., four bits), the NLAT<3:0> (e.g., four bits), the M<3:0> (e.g., four bits), the P2<2:0> (e.g., three bits) that count values of the N-counter 320, the latch 330, the M-counter 360, and the P2-counter 318, respectively, may include more or fewer than the number of bits shown. Additionally, implementations may include more than two random bits for the QLAT<1:0>. The logic of the 250 may use different combinations of the QLAT<1:0> bits to set the MRST signal. For example, the AND gate 398 may be configured to receive the QLAT<1> bit, rather than the QLAT<0> bit. Further, the AND gate 395 may be configured to receive an inverted value of at least one of the QLAT<1:0> bits.

Figure 4:
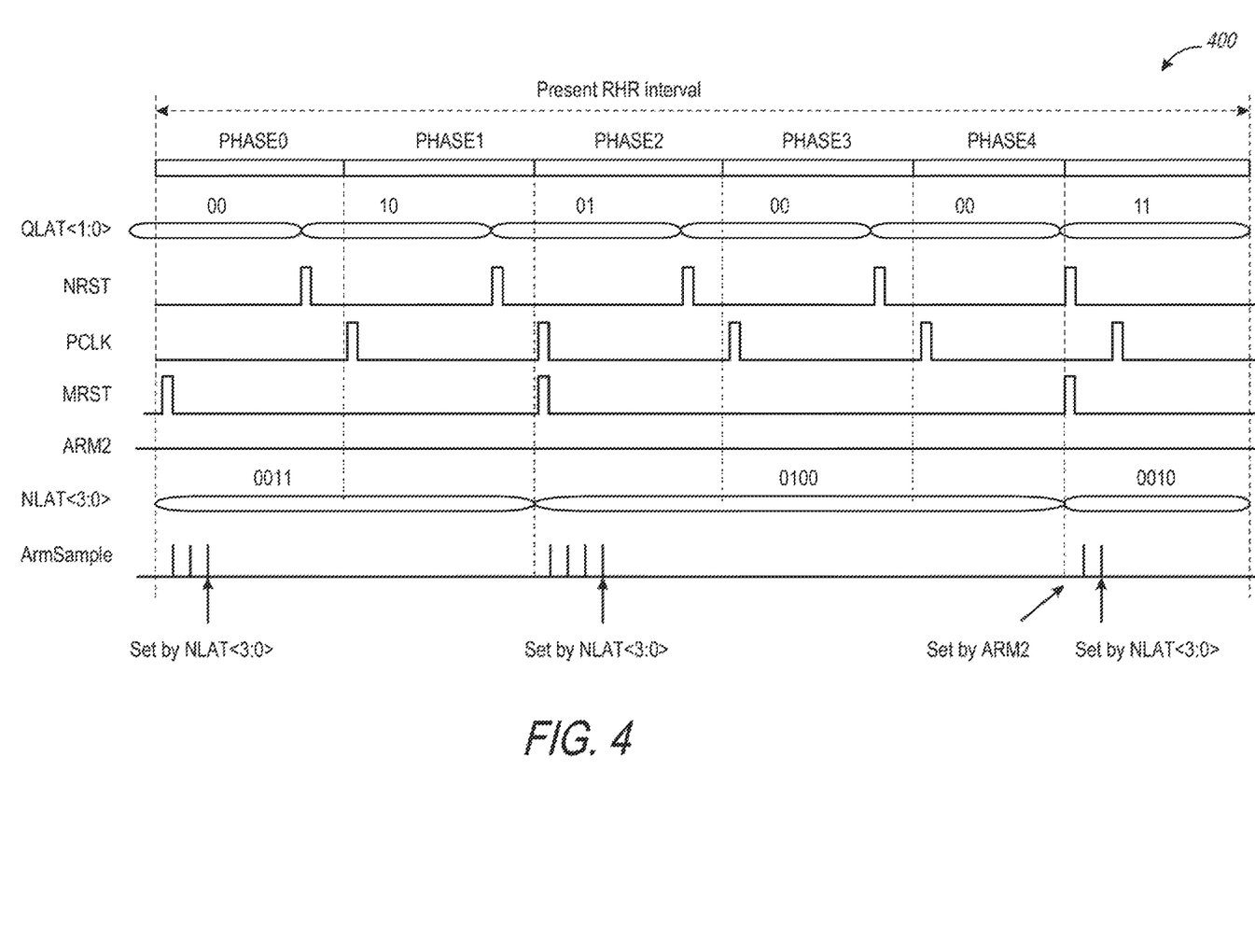
FIG. 4 depicts an exemplary timing diagram associated with operation of a sampling timing generator circuit in accordance with an embodiment of the disclosure.

FIG. 4 depicts an exemplary timing diagram 400 associated with operation of a sampling timing generator circuit in accordance with embodiments of the disclosure. The timing diagram 400 may illustrate operation of the sampling timing generator circuit 120 of FIG. 1 and/or the sampling timing generator circuit 300 of FIGS. 3A and 3B. The QLAT<1:0> bits are a random signal that may correspond to the QLAT<1:0> bits of the randomized counter circuit 380 of FIG. 3A. The NRST signal may correspond to the NRST signal of the sampling trigger circuit 315 of FIG. 3A. The PCLK signal may correspond to the PCLK of the secondary counter circuit 316 of FIG. 3A. The MRST signal may correspond to the MRST signal of the interval circuit 310, the sampling trigger circuit 315, and the counter reset circuit 350 of FIGS. 3A and 3B. The ARM2 signal may correspond to the ARM2 signal of the sampling trigger circuit 315 and the counter reset circuit 350 of FIGS. 3A and 3B. The NLAT<3:0> may correspond to the NLAT<3:0> count value of the sampling trigger circuit 315 of FIG. 3A. The ArmSample signal may correspond to the ArmSample of the sampling timing generator circuit 120 of FIG. 1 and/or the ArmSample signal of the sampling trigger circuit 315 of FIG. 3A.

Because both the NRST and the PCLK signals are generated from counters (e.g., the N-counter 320 and the P1-counter 317, respectively, of FIG. 3A) controlled by oscillations of the RHROsc signal and both count from 0 to one minus the NMAX value, the time period between pulses on those signals are the same. The timing of the pulses may differ because the P1-counter is reset via the RHR signal, and the N-counter is never reset.

During the PHASE0 time period, in response to the pulse on the MRST signal, a latch (e.g., the latch 330 of FIG. 3A) may latch a new value for the NLAT<3:0> count value (e.g., the MRST signal pulse sets the NLATCLK signal via the OR gate 312 of FIG. 3A) and an M-counter (e.g., the M-counter 360 of FIG. 3A) is reset. In this example, the NLAT<3:0> count value is set to 3 (b0011). Because the M-counter is initialized to 0, the NLAT<3:0> count value does not match the M<3:0> count value. In response to the NLAT<3:0> count value not matching the M<3:0> count value, the MATCHF signal is set. In response to the MATCHF signal being set, the ArmSample signal is pulsed at a frequency equal to a frequency of the RHROsc signal (e.g., via the AND gate 372). With each pulse of the ArmSample signal, the M<3:0> count value is incremented. After 3 pulses (e.g., because the NLAT<3:0> count value is set to 3), the M<3:0> count value matches the NLAT<3:0> count value, and in response, the MATCHF signal is set low. In response to the MATCHF signal being set low, the pulses on the ArmSample signal stop (e.g., via the AND gate 372). The sampling timing generator circuit may remain in this state until the M-counter is reset via the MRST signal. In response to the pulse on the NRST signal, a new QLAT<1:0> count value of 2 (b10) is latched (e.g., via the latch 383 of FIG. 3A).

The sampling timing generator circuit may transition to PHASE1 in response to the PCLK signal (e.g., in response to an increment of the P2<2:0> count value from the P2-counter 318 to a value of 1). During the PHASE1 time period, no ArmSample signal pulses are provided because the M-counter signal is not reset via the MRST signal (e.g., the MRST signal remains low). The MRST signal may remain low because the QLAT<0> bit value is low (e.g., using the logic of the OR gate 396 and the AND gate 398 of the counter reset circuit 350 of FIG. 3B). In response to the pulse on the NRST signal, a new QLAT<1:0> count value of 1 (b01) is latched (e.g., via the latch 383 of FIG. 3A).

The sampling timing generator circuit may transition to PHASE2 in response to the PCLK signal (e.g., in response to an increment of the P2<2:0> count value from the P2-counter 318 to a value of 2). During the PHASE2 time period, in response to the QLAT<0> bit being set, a pulse may be provided on the MRST signal (e.g., using the logic of the OR gate 396, the AND gate 398, and the OR gate 399 of the counter reset circuit 350 of FIG. 3B). In response to the pulse on the MRST signal, the latch (e.g., the latch 330 of FIG. 3A) may latch a new value for the NLAT<3:0> count value (e.g., the MRST signal pulse sets the NLATCLK signal via the OR gate 312 of FIG. 3A) and an M-counter (e.g., the M-counter 360 of FIG. 3A) is reset. In this example, the NLAT<3:0> count value is set to 4 (b0100). Because the M-counter is initialized to 0, the NLAT<3:0> count value does not match the M<3:0> count value. In response to the NLAT<3:0> not matching the M<3:0> count value, the MATCHF signal is set. In response to the MATCHF signal being set, the ArmSample signal is pulsed at a frequency equal to a frequency of the RHROsc signal (e.g., via the AND gate 372). With each pulse of the ArmSample signal, the M<3:0> count is incremented. After 4 pulses (e.g., because NLAT<3:0> count value is set to 4), the M<3:0> count value matches the NLAT<3:0> count value, and in response, the MATCHF signal is set low. In response to the MATCHF signal being set low, the pulses on the ArmSample signal stop (e.g., via the AND gate 372). The sampling timing generator circuit may remain in this state until the M-counter is reset. In response to the pulse on the NRST signal, a new QLAT<1:0> count value of 0 (b00) is latched (e.g., via the latch 383 of FIG. 3A).

The sampling timing generator circuit may transition to PHASE3 in response to the PCLK signal (e.g., in response to an increment of the P2<2:0> count value from the P2-counter 318 to a value of 3). During the PHASE3 time period, no ArmSample signal pulses are provided because the M-counter signal is not reset via the MRST signal (e.g., the MRST signal remains low). The MRST signal may remain low because the QLAT<0> bit value is low (e.g., using the logic of the OR gate 396 and the AND gate 398 of the counter reset circuit 350 of FIG. 3B). In response to the pulse on the NRST signal, a new QLAT<1:0> count value of 0 (b00) is latched (e.g., via the latch 383 of FIG. 3A).

The sampling timing generator circuit may transition to PHASE4 in response to the PCLK signal (e.g., in response to an increment of the P2<2:0> count value from the P2-counter 318 to a value of 4, and in response to the interval circuit 310 latching the PHASE4 signal). The PHASE4 time period may persist until an RHR event (e.g., the RHR signal is set). During PHASE4, the MRST signal is set when the QLAT<1:0> value is 3 (b11) low (e.g., using the logic of the AND gate 395, the AND gate 397, and the OR gate 399 of the counter reset circuit 350 of FIG. 3B). Thus, while the QLAT<1:0> signal has a value of 0 (b00), no ArmSample signal pulses are generated. In response to the pulse on the NRST signal, a new QLAT<1:0> count value of 3 (b11) is latched (e.g., via the latch 383 of FIG. 3A). In response to the QLAT<1:0> value of 3 (b11), the ARM2 signal is set (e.g., using the AND gate 395 of FIG. 3B. In response to the ARM2 signal being set, the ArmSample signal is toggled (e.g., using the OR gate 373 and the pulse generator 374 of FIG. 3A), which may cause the M-counter to increment. In response to the M-counter incrementing, the MATCHF signal transitions high. Further, the MRST signal is pulsed while in PHASE4 when the ARM2 signal is set. In response to the pulse on the MRST signal, the latch (e.g., the latch 330 of FIG. 3A) may latch a new value for the NLAT<3:0> count value (e.g., the MRST signal pulse sets the NLATCLK signal via the OR gate 312 of FIG. 3A) and an M-counter (e.g., the M-counter 360 of FIG. 3A) is reset. In this example, the NLAT<3:0> count value is set to 2 (b0010). Because the M-counter is initialized to 0, the NLAT<3:0> count value does not match the M<3:0> count value. In response to the NLAT<3:0> not matching the M<3:0> count value, the MATCHF signal remains set. In response to the MATCHF signal being set, the ArmSample signal is pulsed at a frequency equal to a frequency of the RHROsc signal (e.g., via the AND gate 372). With each pulse of the ArmSample signal, the M<3:0> count is incremented. After 2 pulses (e.g., because NLAT<3:0> count value is set to 2), the M<3:0> count value matches the NLAT<3:0> count value, and in response, the MATCHF signal is set low. In response to the MATCHF signal being set low, the pulses on the ArmSample signal stop (e.g., via the AND gate 372). The sampling timing generator circuit may remain in this state until the M-counter is reset. In response to the pulse on the NRST signal, a new QLAT<1:0> count value of 0 (b00) is latched (e.g., via the latch 383 of FIG. 3A).

Figure 5A:
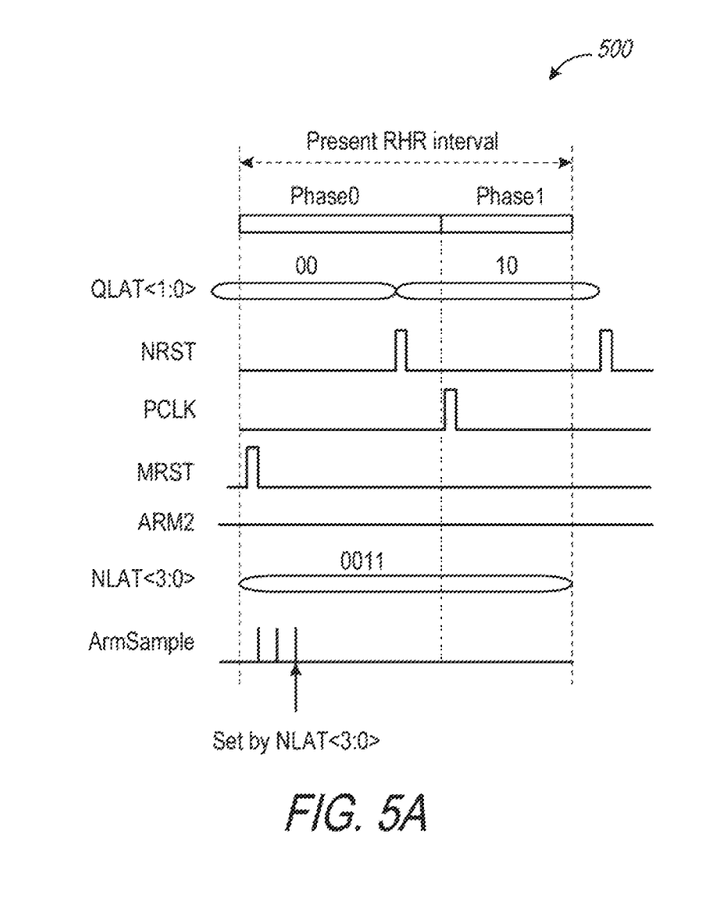
FIGS. 5A and 5B depict exemplary timing diagrams associated with operation of a sampling timing generator circuit in accordance with some embodiments of the disclosure.
Figure 5B:
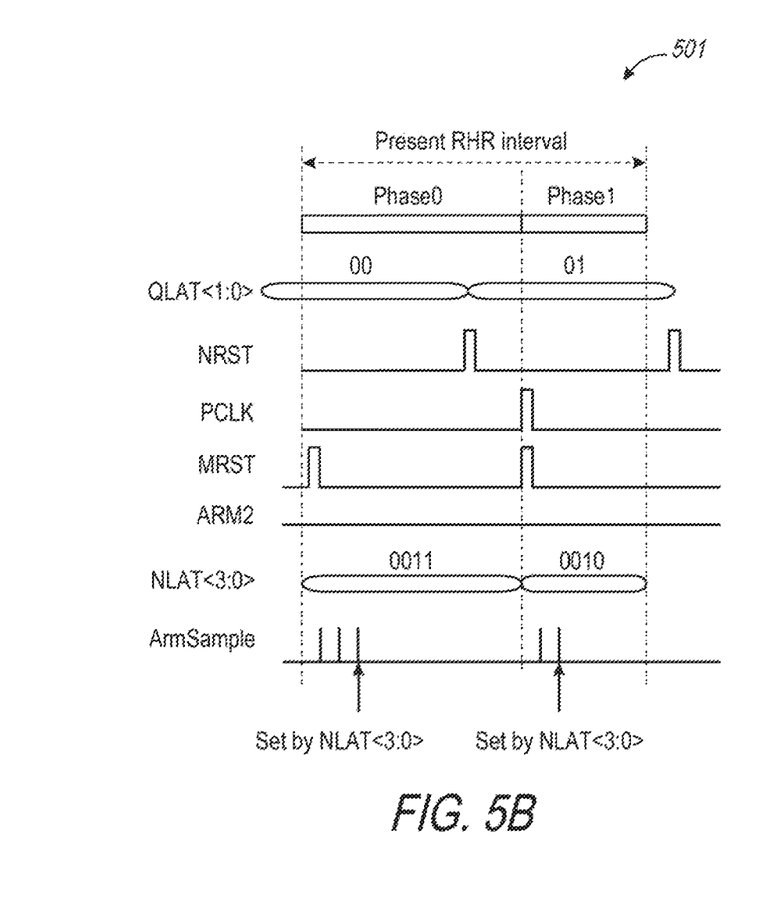

FIGS. 5A and 5B depict exemplary timing diagrams 500 and 501, respectively, associated with operation of a sampling timing generator circuit in accordance with embodiment of the disclosure. The timing diagram 500 may illustrate operation of the sampling timing generator circuit 120 of FIG. 1 and/or the sampling timing generator circuit 300 of FIGS. 3A and 3B. In particular, the timing diagrams 500 and 501 depict the impact of the random value of the QLAT<1:0> on whether the ArmSample signal triggers sampling events. The QLAT<1:0> bits are a random signal may correspond to the QLAT<1:0> signal of the randomized counter circuit 380 of FIG. 3A. The NRST signal may correspond to the NRST signal of the sampling trigger circuit 315 of FIG. 3A. The PCLK signal may correspond to the PCLK of the secondary counter circuit 316 of FIG. 3A. The MRST signal may correspond to the MRST signal of the interval circuit 310, the sampling trigger circuit 315, and the counter reset circuit 350 of FIGS. 3A and 3B. The ARM2 signal may correspond to the ARM2 signal of the sampling trigger circuit 315 and the counter reset circuit 350 of FIGS. 3A and 3B. The NLAT<3:0> may correspond to the NLAT<3:0> count value of the sampling trigger circuit 315 of FIG. 3A. The ArmSample signal may correspond to the ArmSample of the sampling timing generator circuit 120 of FIG. 1 and/or the ArmSample signal of the sampling trigger circuit 315 of FIG. 3A.

Because both the NRST and the PCLK signals are generated from counters (e.g., the N-counter 320 and the P1-counter 317, respectively, of FIG. 3A) controlled by oscillations of the RHROsc signal and both count from 0 to one minus the NMAX value, the time period between pulses on those signals may be the same. The timing of the pulses may differ because the P1-counter is reset via the RHR signal, and the N-counter is never reset.

Referring to both of the timing diagrams 500 and 501, during the PHASE0 time period, in response to the pulse on the MRST signal, a latch (e.g., the latch 330 of FIG. 3A) may latch a new value for the NLAT<3:0> count value (e.g., the MRST signal pulse sets the NLATCLK signal via the OR gate 312 of FIG. 3A) and an M-counter (e.g., the M-counter 360 of FIG. 3A) is reset. In this example, the NLAT<3:0> count value is set to 3 (b0011). Because the M-counter is initialized to 0, the NLAT<3:0> count value does not match the M<3:0> count value. In response to the NLAT<3:0> count value not matching the M<3:0> count value, the MATCHF signal is set. In response to the MATCHF signal being set, the ArmSample signal is pulsed at a frequency equal to a frequency of the RHROsc signal (e.g., via the AND gate 372). With each pulse of the ArmSample signal, the M<3:0> count value is incremented. After 3 pulses (e.g., because the NLAT<3:0> count value is set to 3), the M<3:0> count value matches the NLAT<3:0> count value, and in response, the MATCHF signal is set low. In response to the MATCHF signal being set low, the pulses on the ArmSample signal stop (e.g., via the AND gate 372). The sampling timing generator circuit may remain in this state until the M-counter is reset via the MRST signal.

For the timing diagram 500, in response to the pulse on the NRST signal, a new QLAT<1:0> count value of 2 (b10) is latched (e.g., via the latch 383 of FIG. 3A). For the timing diagram 501, in response to the pulse on the NRST signal, a new QLAT<1:0> count value of 1 (b10) is latched (e.g., via the latch 383 of FIG. 3A). Because the QLAT<0> value is used to determine whether the MRST signal is set during PHASE1 to PHASE3 (e.g., using the AND gate 398 of the counter reset circuit 350 of FIG. 3B), the timing diagrams 500 and 501 operate differently.

In the timing diagram 500, the sampling timing generator circuit may transition to PHASE1 in response to the PCLK signal (e.g., in response to an increment of the P2<2:0> count value from the P2-counter 318 to a value of 1). During the PHASE1 time period, no ArmSample signal pulses are provided because the M-counter signal is not reset via the MRST signal (e.g., the MRST signal remains low). The MRST signal may remain low because the QLAT<0> bit value is low (e.g., using the logic of the OR gate 396 and the AND gate 398 of the counter reset circuit 350 of FIG. 3B).

In the timing diagram 501, in response to the QLAT<0> bit being set, a pulse may be provided on the MRST signal (e.g., using the logic of the OR gate 396, the AND gate 398, and the OR gate 399 of the counter reset circuit 350 of FIG. 3B). In response to the pulse on the MRST signal, the latch (e.g., the latch 330 of FIG. 3A) may latch a new value for the NLAT<3:0> count value (e.g., the MRST signal pulse sets the NLATCLK signal via the OR gate 312 of FIG. 3A) and an M-counter (e.g., the M-counter 360 of FIG. 3A) is reset. In this example, the NLAT<3:0> count value is set to 2 (b0010). Because the M-counter is initialized to 0, the NLAT<3:0> count value does not match the M<3:0> count value. In response to the NLAT<3:0> not matching the M<3:0> count value, the MATCHF signal is set. In response to the MATCHF signal being set, the ArmSample signal is pulsed at a frequency equal to a frequency of the RHROsc signal (e.g., via the AND gate 372). With each pulse of the ArmSample signal, the M<3:0> count is incremented. After 2 pulses (e.g., because NLAT<3:0> count value is set to 2), the M<3:0> count value matches the NLAT<3:0> count value, and in response, the MATCHF signal is set low. In response to the MATCHF signal being set low, the pulses on the ArmSample signal stop (e.g., via the AND gate 372). The sampling timing generator circuit may remain in this state until the M-counter is reset.

The timing diagram 400 of FIG. 4 and the timing diagrams 500 and 501 of FIGS. 5A and 5B, respectively are exemplary. Relative timing may differ in different implementations, and the latched values of various signals may differ from depicted. Specifically, the NLAT<3:0> and QLAT<1:0> count values are intended to be random based on a time at which they are latched.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although various embodiments of the disclosure have been disclosed, it will be understood by those skilled in the art that the scope of the disclosure extends beyond the specifically disclosed embodiments to other alternative embodiments and/or uses and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form alternative embodiments of the disclosure. Thus, it is intended that the scope of at least some of the disclosure should not be limited by the particular disclosed embodiments described above.

What is claimed is:

1. An apparatus comprising:
a memory bank comprising a plurality of rows each associated with a respective row address; and
a sampling timing generator circuit configured to provide a timing signal having a plurality of pulses, wherein each of the plurality of pulses is configured to initiate sampling of a respective row address associated with a row of the plurality of rows to detect a row hammer attack, wherein the sampling timing generator includes first circuitry configured to provide a first subset of pulses of the plurality of pulses during a first time period and includes second circuitry configured to initiate provision of a second subset of pulses of the plurality of pulses during a second time period after the first time period.

2. The apparatus of claim 1, wherein the length of the first time period equal to the length of the second time period.

3. The apparatus of claim 1, wherein a length of the first time period is set based on a maximum value of a first counter and an oscillation signal, and wherein a length of the second time period is set based on a maximum value of a second counter and the oscillation signal.

4. The apparatus of claim 3, wherein first circuitry is configured to provide the first subset of pulses while a latched count value is different than a count value of a third counter, wherein the third counter is incremented in response to each of the first subset of pulses.

5. The apparatus of claim 4, wherein the second circuitry is configured to initiate provision of the second subset of pulses by the first circuit during the second time period based on a random count value.

6. The apparatus of claim 5, wherein the second circuitry is configured to initiate provision of the second subset of pulses by the first circuitry during the second time period when the random count value has a first value.

7. The apparatus of claim 6, wherein the second circuitry is configured to skip provision of the second subset of pulses by the first circuitry during the second time period when the random count value has a second value.

8. The apparatus of claim 6, wherein the second circuitry is configured to initiate provision of a third subset of pulses of the plurality of pulses by the first circuitry during a third time period when the random count value has a second value.

9. The apparatus of claim 3, wherein the sampling timing generator circuit comprises a logic circuit configured to transmit the oscillation signal.

10. The apparatus of claim 1, wherein the second circuitry is configured to be reset to the first time period in response to a row hammer refresh signal being set.

11. An apparatus comprising:
a plurality of memory banks, wherein each memory bank of the plurality of memory banks, includes a latch configured to store an address for interrupt refresh; and
a sampling timing generator circuit configured to receive an oscillation signal, wherein the sampling timing generator circuit comprises first circuitry configured to provide a first set of pulses on a trigger signal to sample the address during a first time period, wherein the sampling timing generator circuit further comprises second circuitry configured to determine whether to initiate provision of a second set of pulses on the trigger signal to sample the address during a second time period, wherein the first time period and the second time period are non-overlapping time periods.

12. The apparatus of claim 11, wherein the second circuitry is configured to initiate the second set of pulses during the second time period in response to a random counter providing a first value, wherein the second circuitry is configured to skip initiation of the second set of pulses during the second time period in response to the random counter circuit providing a second value.

13. The apparatus of claim 11, the second circuitry is configured to be reset to the first time period, in response to a row hammer refresh signal being set.

14. The apparatus of claim 11, wherein the first circuitry includes a counter and a latch, wherein during the first time period the latch is configured to latch a first random value of the counter during the first time period, wherein, in response to the second circuitry determining to initiate the second set of pulses, the latch is configured to latch a second random value of the counter during the second time period.

15. The apparatus of claim 14, wherein a count of the first set of pulses is equal to the first random value and wherein a count of the second set of pulses is equal to the second random value.

16. The apparatus of claim 11, wherein the first time period and the second time period both occur within a same row hammer refresh interval.

17. A method comprising:
during a first time period of a row hammer refresh interval, providing a first subset of pulses on a timing signal from a sampling timing generator circuit to trigger sampling of a respective row address associated with a row of a plurality of rows of a memory bank; and
during a second time period of the row hammer refresh interval after the first time period, initiating provision of a second subset of pulses on the timing signal.

18. The method of claim 17, wherein initiating provision of the second subset of pulses is in response to a random counter circuit providing a first count value.

19. The method of claim 17, wherein the length of the first time period equal to the length of the second time period.

20. The method of claim 17, further comprising resetting to the first time period at a start of a second row hammer refresh interval.

* * * * *